(12) United States Patent
Kim et al.

(10) Patent No.: US 11,348,658 B2
(45) Date of Patent: May 31, 2022

(54) MEMORY CONTROLLER AND STORAGE DEVICE INCLUDING THE SAME

(71) Applicant: FADU Inc., Seoul (KR)

(72) Inventors: Hongseok Kim, Seoul (KR); Sang Hyun Park, Hwaseong-si (KR); Sunggil Hong, Seoul (KR); Hayoung Lim, Seoul (KR); EHyun Nam, Seoul (KR)

(73) Assignee: FADU Inc., Seoul (KR)

( * ) Notice: Subject to any disclaimer, the term of this patent is extended or adjusted under 35 U.S.C. 154(b) by 0 days.

(21) Appl. No.: 17/359,924

(22) Filed: Jun. 28, 2021

(65) Prior Publication Data

US 2022/0005540 A1   Jan. 6, 2022

Related U.S. Application Data

(60) Provisional application No. 63/046,765, filed on Jul. 1, 2020.

(30) Foreign Application Priority Data

Jul. 1, 2020   (KR) ........................ 10-2020-0080802

(51) Int. Cl.
*G11C 29/00*   (2006.01)
*G11C 29/42*   (2006.01)
*G11C 29/18*   (2006.01)
*G11C 29/44*   (2006.01)

(52) U.S. Cl.
CPC .............. *G11C 29/42* (2013.01); *G11C 29/18* (2013.01); *G11C 29/4401* (2013.01); *G11C 2029/1802* (2013.01)

(58) Field of Classification Search
CPC ..... G11C 29/42; G11C 29/18; G11C 29/4401; G11C 2029/1802
See application file for complete search history.

(56) References Cited

U.S. PATENT DOCUMENTS

| 2007/0044006 | A1* | 2/2007 | Yang | ................. | H03M 13/2906 714/785 |
| 2012/0119928 | A1* | 5/2012 | Yang | ................. | H03M 13/3715 341/94 |
| 2018/0210786 | A1* | 7/2018 | Kim | .................... | G06F 11/1068 |

FOREIGN PATENT DOCUMENTS

KR   10-1526317 B1   6/2015
KR   10-2050896 B1   12/2019

OTHER PUBLICATIONS

Korean Notice of Allowance dated Feb. 2, 2021 in counterpart Korean Patent Application No. 10-2020-0080802 (2 pages in Korean).

* cited by examiner

*Primary Examiner* — Mohammed A Bashar
(74) *Attorney, Agent, or Firm* — NSIP Law (57) ABSTRACT

A memory controller and a storage device including the same are provided. The memory controller performs decoding by selecting a decoder of a level enough to correct bit errors in a codeword from among a plurality of error correction code (ECC) decoders based on a bit error history of a non-volatile memory device.

6 Claims, 5 Drawing Sheets

MEMORY CONTROLLER AND STORAGE DEVICE INCLUDING THE SAME

CROSS-REFERENCE TO RELATED APPLICATIONS

This application claims the benefit under 35 USC § 119(e) of US Provisional Application No. 63/046,765 filed on Jul. 1, 2020, and the benefit under 35 USC § 119(a) of Korean Patent Application No. 10-2020-0080802 filed on Jul. 1, 2020, in the Korean Intellectual Property Office, the entire disclosures of which are incorporated herein by reference for all purposes.

BACKGROUND

1. Field

The disclosure relates to a memory controller and a storage device including the same, and more particularly, to a memory controller that controls decoding of a codeword by means of a plurality of error correction code (ECC) decoders using different decoding algorithms, and a storage device including the controller.

2. Description of Related Art

Semiconductor memories are categorized into volatile memory and non-volatile memory according to the storage mechanisms of information. Volatile memories include dynamic random access memory (DRAM) and static random access memory (SRAM). Although the volatile memory provides fast read and write speeds, the volatile memory loses stored information when it is powered off. In contrast, the non-volatile memory maintains its stored information even after it is powered off and thus is used as a storage medium for persistent storage devices such as solid-state drives (SSDs). Non-volatile memories include erasable programmable read only memory (EPROM), electrically erasable programmable read only memory (EEPROM), ferroelectric RAM (FRAM), phase change RAM (PRAM), magnetoresistive RAM (MRAM), and flash memory. Particularly, the flash memory is widely used as an audio and video data storage medium for information devices such as a computer, a smartphone, a digital camera, a voice recorder, and a camcorder.

Since bit-flipping errors may occur in data stored in a non-volatile memory device, an error correction code (ECC) is required to guarantee reliability. When data is written to the non-volatile memory device, an ECC encoding process is performed to add parity to the data. Data to which parity is added through encoding is referred to as a codeword. When the data is read from the non-volatile memory device, the original data is restored by ECC decoding that corrects bit errors in the codeword and removes the added parity. An ECC decoder performing ECC decoding successfully corrects bit errors in a codeword when the number of bit errors is within a correctable range, that is, an error correction capability (ECC capability), but reports an error correction failure for bit errors beyond the ECC capability.

Various decoding algorithms exist for the same ECC, and for each algorithm, there is a trade-off between computation complexity and an ECC capability. Despite the benefit of a larger ECC capability, an algorithm with higher computation complexity has a lower decoding speed and higher power consumption.

To simultaneously satisfy an ECC capability and a decoding speed, multiple ECC decoders using different decoding algorithms may be used in combination in a storage device. For example, a 3-level decoder structure may be proposed. In this example, a level-1 decoder using a decoding algorithm with a highest decoding speed and a lowest ECC capability is first used to decode a codeword, thus securing a decoding speed. If the codeword has bit errors that the level-1 decoder can not correct, a level-2 decoder with a better ECC capability than the level-1 decoder is used for decoding. If the bit errors are beyond the ECC capability of the level-2 decoder, the decoding is performed by a level-3 decoder with a highest ECC capability and a lowest decoding speed.

However, when the level-3 decoder performs decoding in the above structure, the lower-level decoders are unnecessarily used. In addition, since a lower level decoder is frequently used and a higher level decoder is rarely used, a load imbalance occurs between each level decoder.

There is thus a pressing need for a method of solving the above problem that may be encountered with using a plurality of ECC decoders.

SUMMARY

The disclosure has been made in an effort to solve the above-mentioned problems of the prior art, and an aspect of the disclosure is to provide a memory controller for selecting a decoder of a level enough to correct bit errors in a codeword from among a plurality of error correction code (ECC) decoders based on a bit error history of a non-volatile memory device, and performing decoding using the selected decoder.

Another aspect of the disclosure is to provide a memory controller for distributing the load of decoders by monitoring the load state of a decoder of each level and thus avoiding a performance bottleneck.

According to an embodiment of the disclosure, a memory controller includes a decoding unit including N decoders classified sequentially into a level-1 decoder capable of correcting a smallest number of bit errors in a codeword to a level-N decoder capable of correcting a largest number of bit errors in a codeword, and configured to decode a codeword, where N is a natural number equal to or greater than 2, a data structure generator configured to generate a data structure by recording the number of bit errors in a codeword decoded by the decoding unit, for each page address, a decoder level selector configured to select a level-K decoder to decode a first codeword received from a non-volatile memory device from among the level-1 decoder to the level-N decoder, where K is a natural number equal to or greater than 1 and equal to or less than N, and a data structure processor configured to read the number of bit errors from the data structure for the page address from which the first codeword is read and transmit it to the decoder level selector. The decoder level selector may select, as the level-K decoder, a decoder of a minimum level from among decoders capable of correcting as many bit errors as the received number of bit errors or bit errors more than the received number of bit errors.

In the memory controller according to the embodiment of the disclosure, the number of bit errors transmitted by the data structure processor may be the number of bit errors in a latest decoded codeword read from the page address until a time when the level-K decoder is selected.

The memory controller according to the embodiment of the disclosure may further include a decoder load balancer configured to transmit the first codeword to the level-K decoder to decode the first codeword. A load of the level-K decoder may be determined, and when the determined load is greater than a predetermined first threshold, the decoder load balancer may transmit the first codeword to a level-M decoder, where M is a natural number equal to or greater than K+1 and equal to or less than N.

In the memory controller according to the embodiment of the disclosure, the decoder load balancer may sequentially determine loads of decoders, starting with a level-K+1 decoder and select the level-M decoder having a load equal to or less than a predetermined second threshold.

In the memory controller according to the embodiment of the disclosure, in the absence of the page address from which the first codeword was read in the data structure, the data structure processor may transmit the number of bit errors as NULL or "0".

In the memory controller according to the embodiment of the disclosure, the data structure generator may update the number of bit errors in the data structure for the page address after decoding a codeword read from the page address, insert the page address and the number of bit errors of the codeword in a NULL entry, in the absence of the page address in the data structure, and change an existing entry to a new NULL entry and insert the page address and the number of bit errors of the codeword in the new NULL entry, in the absence of the NULL entry.

According to an embodiment of the disclosure, a storage device may include a non-volatile memory device which a codeword is written to and read from, and a memory controller configured to receive the codeword from the non-volatile memory device and decode the received codeword.

The features and advantages of the disclosure will become more apparent from the following description based on the attached drawings.

The terms or words used in the specification and claims should not be interpreted in a conventional and lexical sense. Rather, they should be interpreted as meanings and concepts consistent with the technical idea of the disclosure based on the principle that the inventor can appropriately define the concept of terms in order to explain his or her invention in the best way.

According to the disclosure, decoding is performed by selecting a decoder of a level enough to correct bit errors in a codeword from among a plurality of ECC decoders based on a bit error history of a non-volatile memory device. Therefore, high-level decoding may be immediately performed, while decoding at a level corresponding to a low ECC capability is skipped, thereby reducing unnecessary decoding processes.

Further, as the loads of decoders are distributed by monitoring the load state of each level decoder and thus avoiding a performance bottleneck, decoding load is balanced between different level of decoders.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

The objects, specific advantages, and novel features of the disclosure will become more apparent from the following detailed description and preferred embodiments, examples of which are illustrated in the accompanying drawings. The same reference numerals and signs denote the same or like components even when they are shown in different accompanying drawings from one another. The term as used in the disclosure, "$1^{st}$", "$2^{nd}$", "first" or "second" may be used for the names of various components, not limiting the components. These expressions are used only to distinguish one component from another component. Lest it should obscure the subject matter of the disclosure, a detailed description of well-known technologies is avoided.

Preferred embodiments of the disclosure will be described below in detail with reference to the attached drawings.

Figure 1:
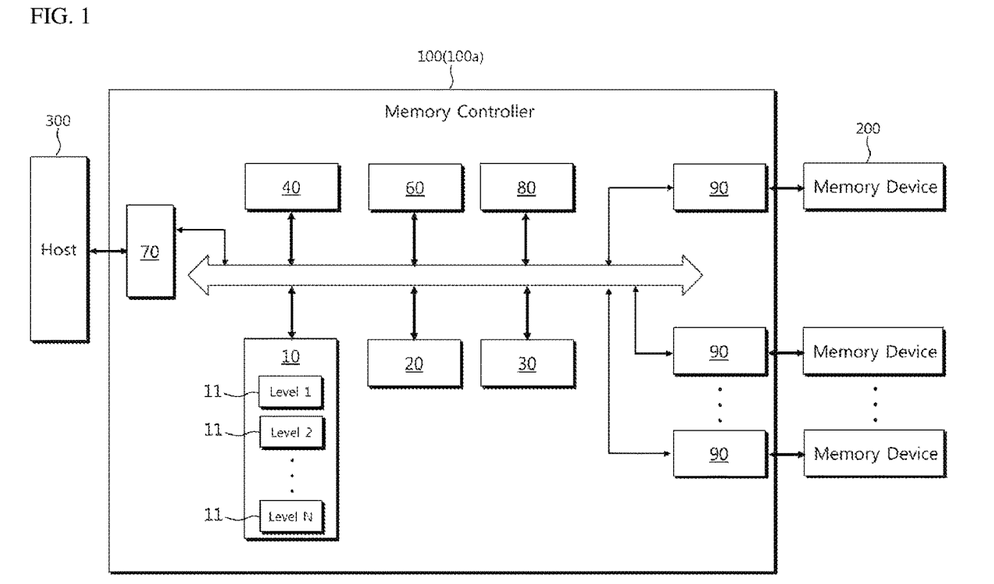
FIG. 1 is a block diagram illustrating a memory controller according to an embodiment of the disclosure.
Figure 2:
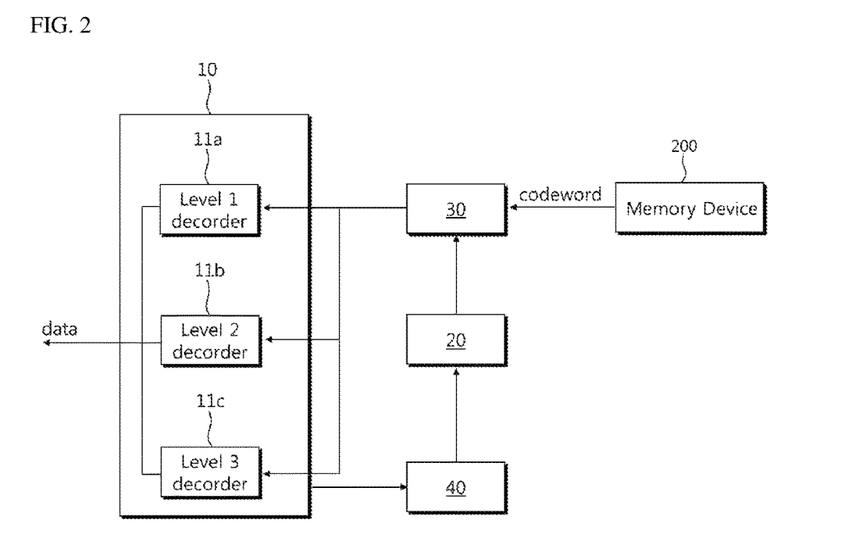
FIG. 2 is a block diagram illustrating an operation of the memory controller according to an embodiment of the disclosure.

FIG. 1 is a block diagram illustrating a memory controller according to an embodiment of the disclosure, and FIG. 2 is a block diagram illustrating an operation of the memory controller according to an embodiment of the disclosure.

Referring to FIGS. 1 and 2, a memory controller 100 (or 100a) according to an embodiment of the disclosure includes a decoding unit 10 which includes N decoders 11 sequentially classified into a level-1 decoder 11 capable of correcting a smallest number of bit errors in a codeword to a level-N decoder capable of correcting a largest number of bit errors in a codeword (N is a natural number equal to or larger than 2) and decodes a codeword, a data structure generator 20 that generates a data structure by recording the number of bit errors of a codeword decoded by the decoding unit 10, for each page address, a decoder level selector 30 which selects a level-K decoder 11 (K is a natural number equal to or larger than 1 and equal to or less than N) to decode a first codeword received from a non-volatile memory device 200, from among the level-1 decoder 11 to the level-N decoder 11, and a data structure processor 40 which reads the number of bit errors from the data structure for the page address from which the first codeword is read and transmits the number of bit errors to the decoder level selector 30. The decoder level selector 30 may select, as the level-K decoder 11, a lowest-level decoder 11 among decoders 11 capable of correcting as many bit errors as the received number of bit errors or bit errors more than the received number of bit errors.

The disclosure relates to the memory controller 100 that controls the non-volatile memory device 200. The memory controller 100 may control the non-volatile memory device 200 in response to a request from a host 300. For example, the memory controller 100 may control the non-volatile memory device 200 to read stored data or write data in response to a data operation request received from the host 300. The host 300 may transmit a data operation request and an address to the memory controller 100 and exchange data with the memory controller 100. For example, the host 300 may exchange data with the memory controller 100 in conformance to at least one of various interface protocols such as a universal serial bus (USB) protocol, a multi-media card (MMC) protocol, a peripheral component interconnection (PCI) protocol, a PCI-express (PCI-E) protocol, an advanced technology attachment (ATA) protocol, a Serial-ATA protocol, a Parallel-ATA protocol, a small computer system interface (SCSI) protocol, an enhanced small disk interface) (ESDI) protocol, an integrated drive electronics (IDE) protocol, a mobile industry processor interface (MIPI) protocol, and a universal flash storage (UFS) protocol. The host 300 may include portable electronic devices such as a mobile phone and a laptop computer, and electronic devices such as a desktop computer, a game console, and a TV.

The memory controller 100 may control write, read, and erase operations of the non-volatile memory device 200 by providing an address ADDR, a command CMD, and a control signal to the non-volatile memory device 200. Data for the operations may be transmitted and received between the memory controller 100 and the non-volatile memory device 200. The non-volatile memory device 200 may include NAND flash memory, vertical NAND (VNAND) flash memory, NOR flash memory, resistive random access memory (RRAM), phase-change random access memory (PRAM), magneto-resistive random access memory (MRAM), ferroelectric random access memory (FRAM), spin transfer torque random access memory (STT-RAM), and a combination thereof. The non-volatile memory device 200 may perform program (write), read, and erase operations in response to signals received from the memory controller 100.

Because bit errors may occur in the non-volatile memory device 200, stored data should be protected by an error correction code (ECC). When data is written to the non-volatile memory device 200, an ECC encoding process is performed to add parity to the data. Data to which parity is added through encoding is referred to as a codeword. When data is read from the non-volatile memory device 200, the original data is restored in an ECC decoding process in which bit errors in a codeword are corrected and an added parity is removed. An ECC decoder performing ECC decoding successfully corrects bit errors in a codeword when the number of bit errors is within a correctable range, that is, its error correction capability (ECC capability) but reports an error correction failure for bit errors beyond its ECC capability.

Various decoding algorithms exist for the same ECC, and for each algorithm, there is a trade-off between computation complexity and an ECC capability. Despite the benefit of a larger ECC capability, an algorithm with higher computation complexity has a lower decoding speed and higher power consumption. Thus, there is a pressing need for a method of simultaneously satisfying an ECC capability and a decoding speed. In this context, the disclosure is devised.

Specifically, the memory controller 100 according to the embodiment of the disclosure includes the decoding unit 10, the data structure generator 20, the decoder level selector 30, and the data structure processor 40.

The decoding unit 10 includes the N decoders 11 (N is a natural number equal to or larger than 2). Because the N decoders 11 use different decoding algorithms for the same ECC, the N decoders 11 also have different ECC capabilities. Thus, the N decoders 11 may be classified into level-1 to level-N decoders according to the number of correctable bit errors in one codeword. Level 1 is defined as a decoder level capable of correcting a smallest number of bit errors, and level N is defined as a decoder level capable of correcting a largest number of bit errors. Accordingly, the level-1 decoder 11 may have a highest decoding speed, despite a lowest ECC capability, and a decoder 11 with a level closer to level N may have an improved ECC capability and a lower decoding speed. For example, as illustrated in FIG. 2, the decoding unit 10 may include three decoders 11 that decode low density parity check (LDPC) codes, each decoder 11 using one of different algorithms: a bit-flipping algorithm, a 2-bit bit-flipping algorithm, and a min-sum algorithm. The bit-flipping algorithm has a highest decoding speed and a lowest ECC capability, whereas the min-sum algorithm has a lowest decoding speed and a highest ECC capability. The 2-bit bit-flipping algorithm is between the bit-flipping algorithm and the min-sum algorithm in terms of decoding speed and ECC capability. Accordingly, the decoders 11 may be sequentially classified into a level-1 decoder 11a using the bit-flipping algorithm, a level-2 decoder 11b using the 2-bit bit flipping algorithm, and a level-3 decoder 11c using the min-sum algorithm. This structure with three decoders is referred to as a "3-level decoder structure". However, the number of decoders in the decoding unit 10 and the used decoding algorithms are not limited to the above specified number of decoders and algorithms.

When a plurality of decoders 11 using different decoding algorithms are used in combination, a codeword may first be decoded by the level-1 decoder 11 using the decoding algorithm with a highest decoding speed and a lowest ECC capability. In the presence of bit errors beyond the ECC capability of the level-1 decoder, the codeword may be decoded by the level-2 decoder with a better ECC capability than that of the level-1 decoder. In this manner, the ECC capability and the decoding speed may be simultaneously satisfied by sequentially decoding a codeword with decoders 11 of higher levels. In this case, however, the lower-level decoders 11 may be used unnecessarily. If the level-1 decoder 11a has an ECC capability of 150-bit error/codeword, the level-2 decoder 11b has an ECC capability of 200-bit error/codeword, and the level-3 decoder 11c has an ECC capability of 500-bit error/codeword in the 3-level decoder structure, the level-3 decoder 11c is used to decode a codeword with a 300-bit error which is beyond the ECC capabilities of the level-1 decoder 11a and the level-2 decoder 11b. In this case, decoding attempts of the level-1 and level-2 decoders 11a and 11b cause unnecessary overhead. Moreover, load balancing may not be achieved between the decoders 11. That is, when codewords each having an error of 140 to 150 bits are continuously input, the error may be corrected successfully by the level-1 decoder 11a. However, because the number of error bits is so large as to be approximate to the ECC capability of the level-1 decoder 11a, the decoding latency may be increased, resulting in a performance bottleneck. Further, the level-2 and level-3 decoders 11b and 11c are not used at all although they are available resources. To avert the problem, the disclosure implements a control technique of selecting a decoder 11 of a level enough to correct bit errors in a codeword from among the plurality of decoders 11 based on a bit error history, to decode a codeword. The bit error history is managed by the data structure generator 20.

The data structure generator 20 generates a data structure reflecting a history of bit errors corrected by the decoding unit 10. The data structure lists the number of bit errors in a decoded codeword, for each page address. For example, the data structure may be generated in the form of an ECC history table such as Table 1 below.

TABLE 1

| Page address | ECC history(# of bit errors) |
|---|---|
| 105 | 45 |
| 4 | 257 |
| 111 | 176 |
| NULL | NULL |
| ... | |
| 1692 | 2 |

In Table 1, a page address is an address including a channel, a die, a block, and a page number of the non-volatile memory device 200. A page address may be delivered along with a codeword from the non-volatile memory device 200 to the memory controller 100. Because the numbers of bit errors included in the data structure are for already decoded codewords, information about a page address and the number of bit errors may be received from the decoding unit 10. The listed numbers of bit errors may be for the latest accessed pages. At least one codeword may be stored in a page which is a read unit of the non-volatile memory device 200. Once a stored codeword is decoded, the number of bit errors in the codeword is written at a corresponding page address in the data structure. In this manner, the data structure generator 20 may continuously update the data structure along with codeword decoding. In the absence of the page address for the decoded codeword in the data structure, the page address and the number of bit errors in the codeword may be inserted in a NULL entry. When even a NULL entry is not present, one of the existing entries may be changed to a new NULL entry and the page address and the number of bit errors in the codeword may be inserted in the new NULL entry. The data structure generated in the above manner may be a base for selecting a decoder level at the decoder level selector 30.

The decoder level selector 30 selects the level of a decoder 11 to decode the first codeword received from the non-volatile memory device 200. The first codeword is a new codeword to be decoded, which is distinguished from a codeword which has already been decoded and the information about which has been reflected in the data structure. The decoder level selector 30 selects one of the level-1 decoder 11 to the level-N decoder 11. Hereinafter, the selected decoder 11 is defined as a level-K decoder 11 (K is a natural number equal to or larger than 1 and equal to or less than N). The selection of the level-K decoder 11 is made based on the number of bit errors returned by the data structure processor 40.

The data structure processor 40 has the page address of the first codeword and transmits the number of bit errors written at the page address in the data structure to the decoder level selector 30. The transmitted number of bit errors is for the latest accessed page. That is, the transmitted number of bit errors may be for the latest decoded codeword until the time the level-K decoder 11 is selected. The data structure processor 40 returns the number of bit errors at the page address corresponding to the first codeword. In the absence of the page address, the number of bit errors may be returned as NULL or a zero value.

When the data structure processor 40 transmits the number of bit errors in the above manner, the decoder level selector 30 receives the number of bit errors and accordingly selects the level-K decoder 11. Specifically, the decoder level selector 30 selects, as the level-K decoder 11, a lowest-level decoder among decoders 11 capable of correcting the received number of or more bit errors. For example, in the 3-level decoder structure and Table 1, when the page address of the first codeword is 105, the number of bit errors is 45 bits, which is within the ECC capabilities of level 1 to level 3. Therefore, level 1 is selected as level K. When the page address of the first codeword is 111, the number of bit errors is 176 bits and thus level 2 is selected as level K.

The selected level-K decoder 11 decodes the first codeword, thereby preventing unnecessary use of a lower level decoder 11 and satisfying an ECC capability and a decoding speed simultaneously, as is the case with the page address 111 of the first codeword.

The memory controller 100 according to the disclosure may further include an encoder 60 for ECC encoding. The encoder 60 generates a codeword by adding parity for error correction to data which has been received from the host 300 and is to be stored in the non-volatile memory device 200.

The memory controller 100 according to the disclosure may further include a host interface 70 as a means for providing an interface with the host 300. The host interface 70 may be connected to the host 300 through one or more channels or ports. For example, the host interface 70 is connected to the host 300 through any one or all of a parallel AT attachment (PATA) bus, a serial AT attachment (SATA) bus, and a peripheral component interconnect express (PCIe) bus, or to the outside through an SCSI, a USB, or the like.

The memory controller 100 according to the disclosure may further include a memory channel controller 90 as a means for providing an interface with the non-volatile memory device 200. Herein, at least one non-volatile memory device 200 may be provided, and a plurality of memory channel controllers 90 may be used to support the plurality of non-volatile memory devices 200. One or more non-volatile memory devices 200 may be connected to one memory channel controller 90 and share the same data bus.

The memory controller 100 according to the disclosure may further include a processor 80 that provides overall control to the operations of the memory controller 100 in order to process a data operation request from the host 300. The processor 80 may be implemented as a micro control unit (MCU), a central processing unit (CPU), or the like, and may control functions of the memory controller 100 by executing software.

Figure 3:
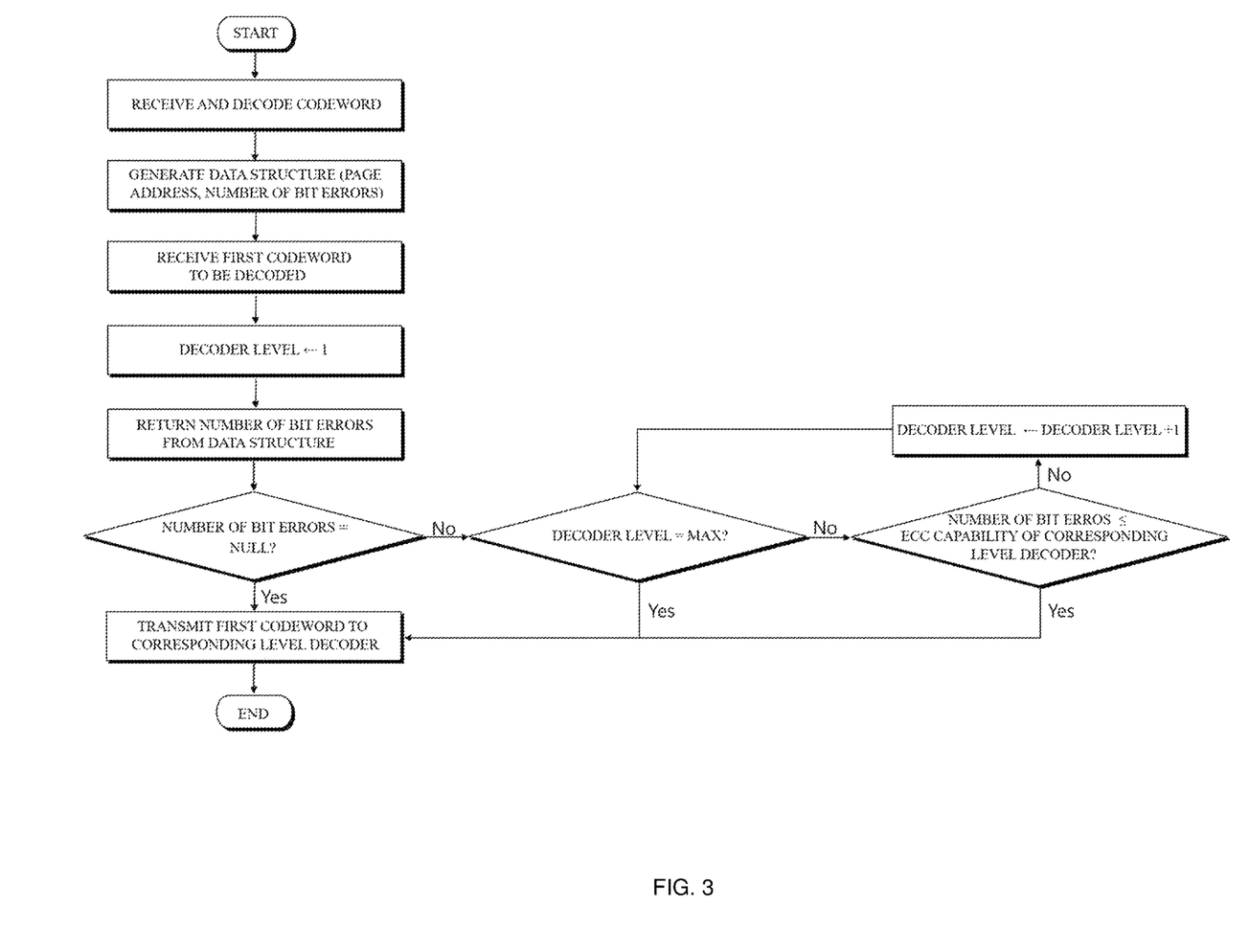
FIG. 3 is a flowchart illustrating a method of operating the memory controller according to an embodiment of the disclosure.

Now, a detailed description will be given of a method of operating the memory controller according to an embodiment of the disclosure. FIG. 3 is a flowchart illustrating a method of operating the memory controller according to an embodiment of the disclosure.

The memory controller 100 according to the disclosure may receive a codeword from a non-volatile memory device in response to a read request from a host, decode the codeword, and then generate a data structure. In the data structure, the number of bit errors may be updated for each of the page addresses of decoded codewords. When a first codeword to be newly decoded arrives, level 1 may be assigned as a decoder level, and the number of bit errors at a page address in the data structure may be returned with the page address received along with the first codeword. In this case, it is determined whether the number of bit errors is NULL. If the number of bit errors is NULL, the first codeword may be transmitted to a level-1 decoder to be decoded. When the number of bit errors is not NULL, it is determined whether the decoder level is a maximum level.

When the decoder level is not the maximum level, the returned number of bit errors may be compared with the ECC capability of the level-1 decoder. In this case, if the returned number of bit errors is within the ECC capability of the level-1 decoder, the first codeword may be transmitted to the level-1 decoder to be decoded. On the other hand, if the returned number of bit errors is beyond the ECC capability of the level-1 decoder, a decoder of a level enabling error correction may be selected, while incrementing the decoder level by 1 each time. If the decoder level reaches the maximum level in this process, the decoding may be performed by a maximum-level decoder.

Figure 4:
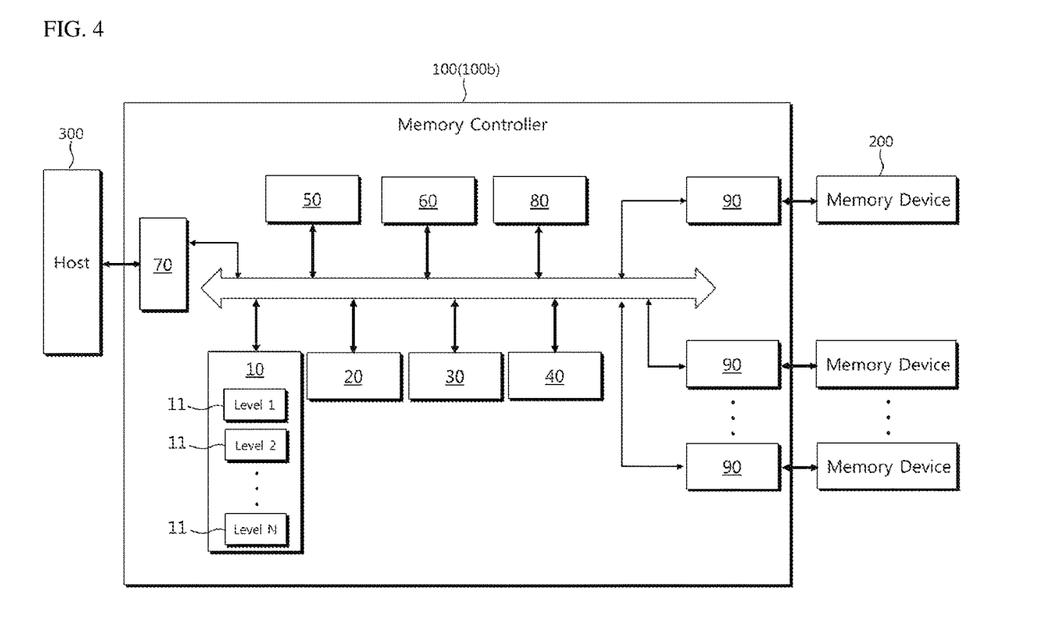
FIG. 4 is a block diagram illustrating a memory controller according to another embodiment of the disclosure.
Figure 5:
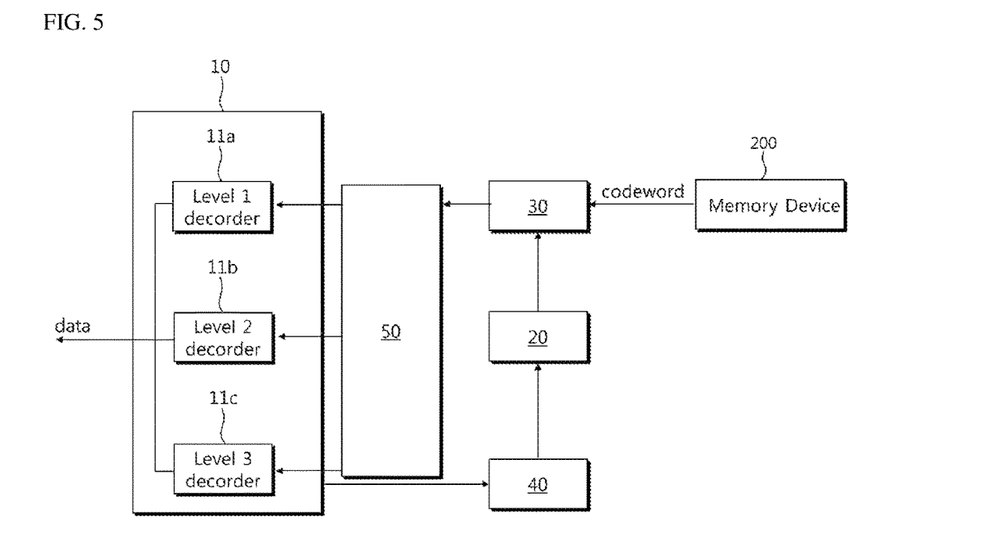
FIG. 5 is a block diagram illustrating an operation of the memory controller according to another embodiment of the disclosure.

FIG. 4 is a block diagram illustrating a memory controller according to another embodiment of the disclosure, and FIG. 5 is a block diagram illustrating an operation of the memory controller according to another embodiment of the disclosure.

Referring to FIGS. 4 and 5, a memory controller 100b according to another embodiment of the disclosure may further include a decoder load balancer 50 as a means for maintaining load balance between a plurality of decoders 11.

The decoder load balancer 50 transmits a first codeword to a level-K decoder 11 selected by the decoder level selector 30 so that the first codeword is decoded, and determines the degree of load of the level-K decoder 11. When the level-K decoder 11 is overloaded, the first codeword may be transmitted to a level-M decoder 11 (M is a natural number equal to or greater than K+1 and equal to or less than N). Since the level-M decoder 11 has a higher ECC capability than the level-K decoder 11, the level-M decoder 11 may correct bit errors in the first codeword. When codewords to be decoded are continuously concentrated in the level-K decoder 11, the decoding latency of the level-K decoder 11 increases. Therefore, the decoder 11 to decode the first codeword is switched to the level-M decoder 11 to distribute load. When the load of the level-K decoder 11 exceeds a predetermined first threshold, the decoder load balancer 50 may select the level-M decoder 11, for decoding. In this case, the decoder load balancer 50 may determine overload by monitoring the state of the input queue of the level-K decoder 11. Since codewords waiting to be decoded are accommodated in the input queue, overload may be determined when the codewords are filled to a certain level within a maximum accommodation range of the input queue. For example, if more than 40 codewords are filled in the input queue of the level-K decoder 11 that stores up to 50 codewords, the decoder load balancer 50 may make the level-M decoder 11, that is, a level-K+1 decoder 11 perform decoding.

In the above case, the decoder load balancer 50 may also determine the load of the level-K+1 decoder 11. When the level-K+1 decoder is overloaded, the decoder load balancer 50 may sequentially determine the loads of the level-K+2 or higher level decoders 11 and select a decoder 11 having a load less than or equal to a second threshold as the level-M decoder 11, for decoding. For example, when the level-1 decoder 11 is selected by the decoder level selector 30, the decoder load balancer 50 determines the load of the level-1 decoder 11 through the input queue of the level-1 decoder 11. When the level-1 decoder 11 is overloaded, the decoder load balancer 50 sequentially determines the load of the level-2 decoder 11. When the level-2 decoder 11 is not overloaded, the level-2 decoder 11 is made to decode. When the level-2 decoder 11 is overloaded, the load of the level-3 decoder 11 is determined. In this manner, the load of each decoder 11 is distributed.

Figure 6:
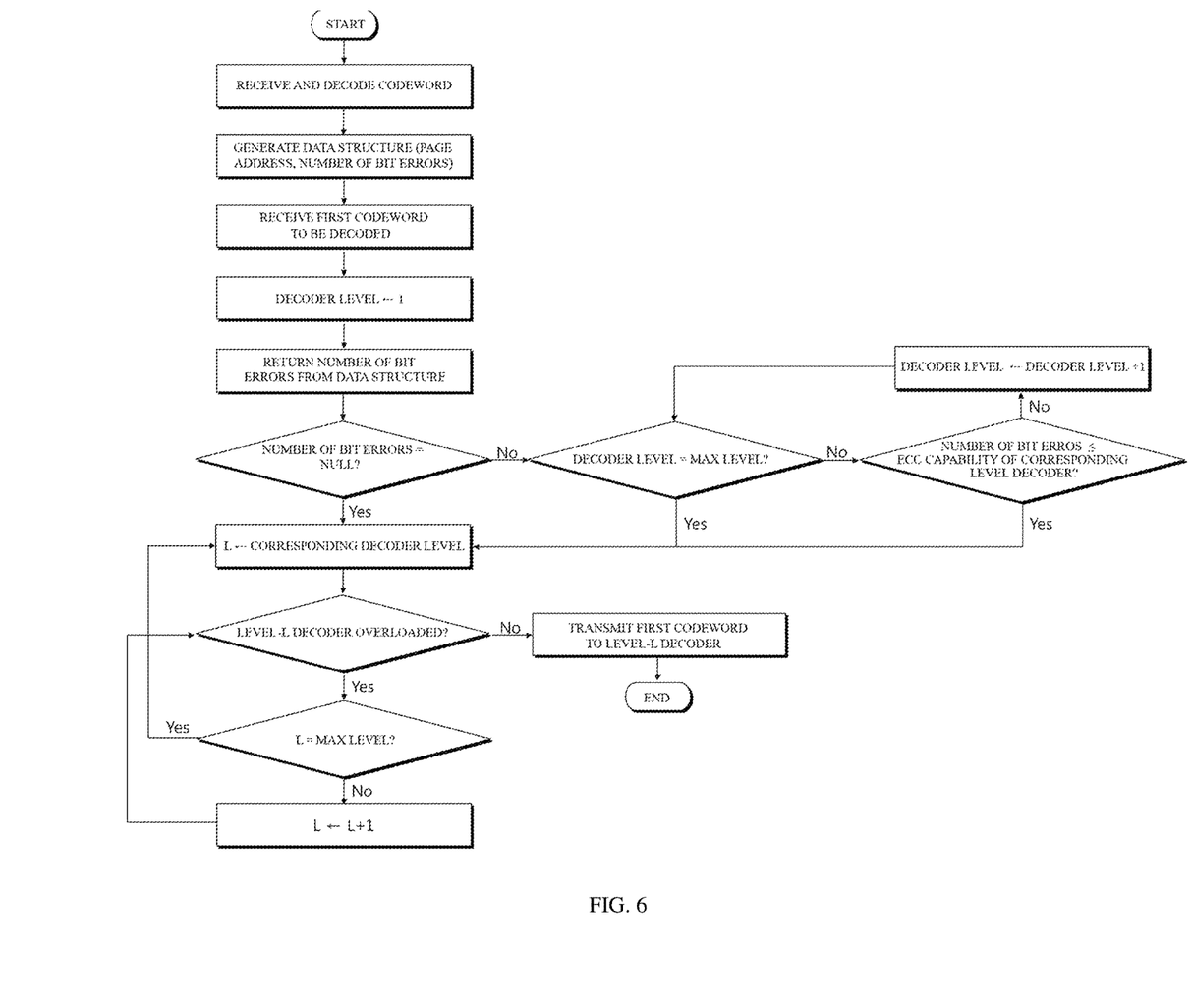
FIG. 6 is a flowchart illustrating a method of operating the memory controller according to another embodiment of the disclosure.

The disclosure will be described in more detail with reference to a method of operating a memory controller according to another embodiment of the disclosure. FIG. 6 is a flowchart illustrating a method of operating a memory controller according to another embodiment of the disclosure.

Compared to FIG. 3 illustrating the method of operating the memory controller 100a (see FIG. 1) according to an embodiment of the disclosure, the memory controller 100b (see FIG. 4) according to another embodiment of the disclosure performs a decoder load distribution process after selecting a decoder level based on the number of bit errors in a data structure. Referring to FIG. 3, once a decoder level is selected, the memory controller may determine whether a decoder of the selected level is overloaded. The decision may be made by checking the state of the input queue of the selected level decoder. When it is determined that the selected level decoder is not overloaded, a first codeword may be transmitted to the selected level decoder, for decoding. On the contrary, when the selected level decoder is overloaded, it is determined whether the level is a maximum level. When the level is the maximum level, a maximum level decoder may decode the first codeword after waiting until the overload is resolved. On the contrary, when the level is not the maximum level, the level is incremented by 1 each time, and the above process of determining and processing the overload may be repeated.

The data structure generator 20, the decoder level selector 30, the data structure processor 40, and the decoder load balancer 50 may be implemented in hardware or software, alone or in a combination of at least two of them. That is, the data structure generator 20, the decoder level selector 30, the data structure processor 40, and the decoder load balancer 50 may be implemented in the form of a digital or analog circuit located inside the memory controller 100, may be implemented as separate chips or modules and connected to the memory controller 100, or may be implemented by storing and executing software in an internal memory such as SRAM or an external memory such as floppy disk, compact disk, or USB flash drive. In addition, the data structure generator 20, the decoder level selector 30, the data structure processor 40, and the decoder load balancer 50 may be implemented in a user-programmable form or may be integrated into another built-in module (e.g., a processor).

The memory controller according to the disclosure may be applied to a storage device, which will be described below.

Figure 7:
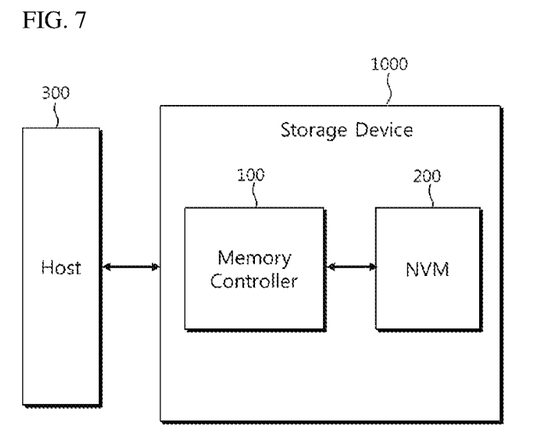
FIG. 7 is a block diagram illustrating a storage device according to an embodiment of the disclosure.
Figure 8:
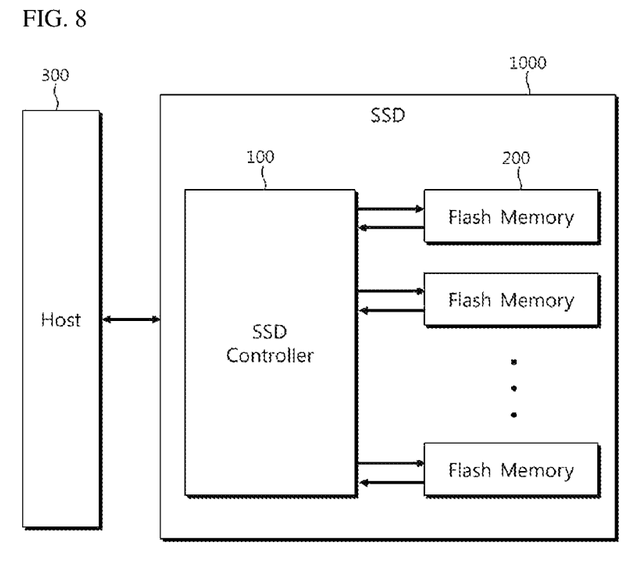
FIG. 8 is a block diagram illustrating a sold-state drive (SSD) to which the storage device is applied according to an embodiment of the disclosure.

FIG. 7 is a block diagram illustrating a storage device according to an embodiment of the disclosure, and FIG. 8 is a block diagram illustrating an example in which the storage device according to the embodiment of the disclosure is applied to an SSD.

As illustrated in FIG. 7, a storage device 1000 according to an embodiment of the disclosure may include a non-volatile device 200 which a codeword is written to and read from, and a memory controller 100 which receives a codeword from the non-volatile memory device 200 and decodes the codeword.

The storage device 1000 may include a memory card or a detachable storage device. The storage device 1000 is coupled to the host 300 and exchanges data with the host 300 via the host interface 70. The storage device 1000 may receive power from the host 300 and perform an internal operation.

The nonvolatile memory device 200 may be implemented as a flash memory. The memory controller 100 may include N (N is a natural number equal to or larger than 2) decoders using different decoding algorithms, maintain a data structure based on the bit error history of the non-volatile memory device 200, and when if the number of bit errors is large in the data structure referred during a read operation, immediately performs high-level decoding, while skipping low-level decoding, thereby reducing unnecessary decoding processes. Further, it is possible to distribute the loads of decoders in a manner that avoids a performance bottleneck by monitoring the state of the input queue for each level decoder. The load distribution has been described before, and thus its detailed description will be avoided herein.

Referring to FIG. 8, the storage device 1000 according to the disclosure may be an SSD. Since the SSD is connected to the host 300, the host 300 may write data to the SSD or read data stored in the SSD. The SSD may exchange signals with the host 300 via the host interface 70 and receive power through a power connector. The SSD may include a plurality of non-volatile memory devices 200 and an SSD controller. The non-volatile memory devices 200 may be implemented as PRAM, MRAM, ReRAM, FRAM, or the like in addition to flash memory, and the plurality of non-volatile memory devices 200 may be connected to the SSD controller through a plurality of channels. One or more non-volatile memory devices 200 may be connected to one channel, and the non-volatile memory devices 200 connected to one channel may be connected to the same data bus.

The memory controller 100 according to the disclosure is provided as an SSD controller and transmits and receives signals to and from the host 300 via the host interface. Commands, addresses, data, and so on may be transmitted in signals, and data is written to or read from a non-volatile memory device 200 according to a command from the host 300.

While the disclosure has been described in detail with reference to specific embodiments, the embodiments are intended only for describing the disclosure, not limiting the disclosure. It is apparent to those skilled in the art that many variations or modifications can be made without departing the scope and spirit of the disclosure.

Simple modifications and changes of the disclosure fall within the scope of the disclosure and the specific protection scope of the disclosure will become apparent from the appended claims.

What is claimed is:

1. A memory controller comprising:
a decoding unit including N decoders classified sequentially into a level-1 decoder capable of correcting a smallest number of bit errors in a codeword to a level-N decoder capable of correcting a largest number of bit errors in a codeword, and configured to decode a codeword, where N is a natural number equal to or greater than 2;
a data structure generator configured to generate a data structure by recording the number of bit errors in a codeword decoded by the decoding unit, for each page address;
a decoder level selector configured to select a level-K decoder to decode a first codeword received from a non-volatile memory device from among the level-1 decoder to the level-N decoder, where K is a natural number equal to or greater than 1 and equal to or less than N;
a data structure processor configured to read the number of bit errors from the data structure for the page address from which the first codeword is read and transmit the number of bit errors to the decoder level selector; and
a decoder load balancer configured to transmit the first codeword to the level-K decoder to decode the first codeword,
wherein the decoder level selector selects, as the level-K decoder, a decoder of a minimum level from among decoders capable of correcting as many bit errors as the received number of bit errors or bit errors more than the received number of bit errors, and
wherein a load of the level-K decoder is determined, and when the determined load is greater than a predetermined first threshold, the decoder load balancer transmits the first codeword to a level-M decoder, where M is a natural number equal to or greater than K+1 and equal to or less than N.

2. The memory controller according to claim 1, wherein the number of bit errors transmitted by the data structure processor is the number of bit errors in a latest decoded codeword read from the page address until a time when the level-K decoder is selected.

3. The memory controller according to claim 1, wherein the decoder load balancer sequentially determines loads of decoders, starting with a level-K+1 decoder and selects the level-M decoder having a load equal to or less than a predetermined second threshold.

4. The memory controller according to claim 1, wherein in the absence of the page address from which the first codeword was read in the data structure, the data structure processor transmits the number of bit errors as NULL or "0".

5. The memory controller according to claim 1, wherein the data structure generator updates the number of bit errors in the data structure for the page address after decoding a codeword read from the page address, inserts the page address and the number of bit errors of the codeword in a NULL entry, in the absence of the page address in the data structure, and changes an existing entry to a new NULL entry and inserts the page address and the number of bit errors of the codeword in the new NULL entry, in the absence of the NULL entry.

6. A storage device comprising:
a non-volatile memory device which a codeword is written to and read from; and
the memory controller configured to receive the codeword from the non-volatile memory device and decode the received codeword according to claim 1.

* * * * *